(12) United States Patent
Schwind et al.

(10) Patent No.: US 9,627,174 B2
(45) Date of Patent: *Apr. 18, 2017

(54) MULTI SPECIES ION SOURCE

(71) Applicant: FEI Company, Hillsboro, OR (US)

(72) Inventors: Gregory A. Schwind, Portland, OR (US); N. William Parker, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/973,424

(22) Filed: Dec. 17, 2015

(65) Prior Publication Data

US 2016/0104599 A1    Apr. 14, 2016

Related U.S. Application Data

(63) Continuation of application No. 13/902,386, filed on May 24, 2013, now Pat. No. 9,224,569.

(60) Provisional application No. 61/666,518, filed on Jun. 29, 2012.

(51) Int. Cl.
*H01J 37/08* (2006.01)
*H01J 37/21* (2006.01)
*H01J 27/20* (2006.01)

(52) U.S. Cl.
CPC .......... *H01J 37/21* (2013.01); *H01J 27/205* (2013.01); *H01J 37/08* (2013.01); *H01J 2237/006* (2013.01); *H01J 2237/082* (2013.01); *H01J 2237/0827* (2013.01); *H01J 2237/31749* (2013.01)

(58) Field of Classification Search
CPC ........ H01J 2237/006; H01J 2237/0827; H01J 49/107; H01J 2237/0825; H01J 49/147
See application file for complete search history.

(56) References Cited

U.S. PATENT DOCUMENTS

| | | |
|---|---|---|
| 4,500,787 A | 2/1985 | Le Poole et al. |
| 4,670,685 A | 6/1987 | Clark, Jr. et al. |
| 4,933,551 A | 6/1990 | Bernius et al. |
| 5,083,061 A | 1/1992 | Koshiishi et al. |
| 5,300,785 A | 4/1994 | Aitken |
| 6,218,672 B1 | 4/2001 | Alig |
| 6,545,269 B1 | 4/2003 | Pierrejean et al. |
| 6,693,282 B1 | 2/2004 | Tiemeijer |
| 7,241,361 B2 | 7/2007 | Keller et al. |
| 7,442,942 B2 | 10/2008 | Takahashi et al. |
| 7,772,564 B2 | 8/2010 | Kruit et al. |

(Continued)

FOREIGN PATENT DOCUMENTS

| | | |
|---|---|---|
| EP | 2088613 | 8/2009 |
| JP | H03276546 | 12/1991 |
| WO | 0243803 A | 6/2002 |

*Primary Examiner* — Brooke Purinton
(74) *Attorney, Agent, or Firm* — Scheinberg & Associates, P.C.; Michael O. Scheinberg

(57) ABSTRACT

A high brightness ion source with a gas chamber includes multiple channels, wherein the multiple channels each have a different gas. An electron beam is passed through one of the channels to provide ions of a certain species for processing a sample. The ion species can be rapidly changed by directing the electrons into another channel with a different gas species and processing a sample with ions of a second species. Deflection plates are used to align the electron beam into the gas chamber, thereby allowing the gas species in the focused ion beam to be switched quickly.

20 Claims, 13 Drawing Sheets

(56) References Cited

U.S. PATENT DOCUMENTS

| | | |
|---|---|---|
| 7,968,855 B2 | 6/2011 | Frosien |
| 8,076,650 B2 | 12/2011 | Smith et al. |
| 8,168,957 B2 | 5/2012 | Keller et al. |
| 8,253,118 B2 | 8/2012 | Zhang et al. |
| 8,405,054 B2 | 3/2013 | Smith et al. |
| 8,445,870 B2 | 5/2013 | Zhang et al. |
| 8,455,822 B2 | 6/2013 | Rue |
| 2003/0057378 A1 | 3/2003 | Pierrejean et al. |
| 2006/0097645 A1 | 5/2006 | Horsky |
| 2007/0262263 A1 | 11/2007 | Kruit et al. |
| 2008/0142702 A1 | 6/2008 | Frosien et al. |
| 2009/0309018 A1 | 12/2009 | Smith et al. |
| 2010/0108902 A1 | 5/2010 | Frosien et al. |
| 2011/0272593 A1 | 11/2011 | Graf et al. |
| 2012/0056088 A1 | 3/2012 | Rue |
| 2012/0168638 A1 | 7/2012 | Parker |
| 2012/0217152 A1 | 8/2012 | Miller |
| 2012/0280136 A1 | 11/2012 | Zhang et al. |
| 2012/0319000 A1 | 12/2012 | Keller et al. |
| 2013/0015765 A1 | 1/2013 | Graupera et al. |
| 2013/0112890 A1 | 5/2013 | Parker et al. |
| 2013/0134307 A1 | 5/2013 | Routh, Jr. |
| 2013/0140450 A1 | 6/2013 | Graupera et al. |
| 2013/0248490 A1 | 9/2013 | Rasmussen et al. |

MULTI SPECIES ION SOURCE

This Application is a Continuation of U.S. patent application Ser. No. 13/902,386, filed May 24, 2013, which claims priority from U.S. Prov. Appl. No. 61/666,518, filed Jun. 29, 2012, both of which are hereby incorporated by reference.

TECHNICAL FIELD OF THE INVENTION

The present invention relates to the field of ion gas sources for charged particle beam systems.

BACKGROUND OF THE INVENTION

Particle-optical apparatus with focused ion beams are applied in the semiconductor industry for the purpose of processing wafers with focused ion beams. To this end, an ion source is imaged onto the wafer into a so-called ion spot. The processing speed with such ion sources is limited by the ion current density in this ion spot. A high ion current density is achieved by focusing a bright ion source into the ion spot. It is desirable to use ions which do not remain behind in the processed wafers, such as noble gas ions.

A gas ion source for a particle optical apparatus is described in U.S. Pat. No. 7,772,564, hereby incorporated by reference, which is assigned to FEI Company, Inc., the assignee of the present invention. The gas source comprises a diaphragm wall, at a first side of which diaphragm wall is located a gas that is to be ionized, at a gas pressure of, for example, 0.2 bar. At the other side of the diaphragm wall is located vacuum, or at least a space with lower gas pressure. In the diaphragm wall, an exit diaphragm is fitted, through which exit diaphragm gas flows out into the vacuum. Electrons generated by an electron source at the vacuum side of the diaphragm wall are accelerated by a first electric field, the acceleration field, and focused by an electron lens, whereby the electron focus is located just before the exit diaphragm on the vacuum side of the diaphragm wall. As a result of collisions between the electrons in the electron focus and the emerging gas atoms, gas ions are now formed in an ionization volume that is thus in the direct vicinity of the exit diaphragm. The volume of the ionization volume is determined by the region in which, concurrently, a high electron density and also a high gas density occur. The ions are extracted from the ionization volume with the aid of a second electric field, the extraction field, and can then be imaged and manipulated with the aid of particle-optical means known in the prior art.

Gas sources, such as the source described in U.S. Pat. No. 7,772,564, can maintain a high brightness by keeping the ionization volume small, seeing as the brightness is otherwise limited by plasma and space-charge effects. Currently, electron sources, such as sources employing field emitters, Schottky emitters or Carbon Nano Tubes, are often used when there is a need for high brightness electron sources. These sources have small electron-emitting surfaces. As known to the skilled artisan, these sources should be imaged by optics with small aberrations, especially when a relative large current in the image is to be obtained. In some applications, electrons are provided with a "sideways injection" into the ionization volume such that the electrons are applied perpendicular to the field extracting the ions from the ionization volume.

The gas source in U.S. Pat. No. 7,772,564 is limited to provide a single ion species. However, there are certain applications when the use of multiple ion species is desired due to different characteristics of the ion species. For example, a light ion is well suited for microscopy because of its low sputter yield, and a heavy ion with a high sputter yield is well suited for milling applications. Choosing an ion species with specific chemical properties can also greatly enhance applications such as beam chemistry or analysis.

Moreover, it is also desirable to change between different ion species quickly and efficiently while operating the particle optical apparatus in order to tailor to certain applications. Current systems require users to change the single gas source entirely and replace it when a new ion species is desired, which is time consuming and requires processing of the sample to be interrupted, thereby causing processing errors such as positional errors or reaction errors due to excess time.

Prior art liquid metal ion sources (LMIS) employ a mass filter capable of separating species of a common source. However, LMIS typically do not achieve the same brightness levels as a gas source. Further, the mass filter operates by first ionizing a common source and then can only separate a few metallic species from the source. The species that are separated are limited by the composition of the source. Thus, there is a need for a high brightness ion source that can rapidly switch between multiple different ion gas species. Moreover, there is a need for a system that enables the user to selectively provide gases of different ion species for performing different treatments of a specimen such as milling, etching, deposition and imaging, without requiring replacing the source.

SUMMARY OF THE INVENTION

An object of the invention is to allow fast switching between multiple ion species for focused ion beam applications.

Embodiments of the invention provides a high brightness ion source with a gas chamber including multiple channels, wherein the multiple channels each have a different gas. An electron beam is focused into one of the channels to form ions of a certain species for sample processing. The ion species is switched by directing the electron beam to a channel with a different species of gas. In an embodiment of the invention, deflection plates are used to direct the electron beam into multiple chambers, thereby allowing the gas species in the focused ion beam to be switched quickly.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the present invention allow the user to switch between multiple different ion species quickly for any focused ion beam application, particularly for high brightness applications using a gas source. This is particularly advantageous when performing different types of processing. For example, helium could be used if low-damage imaging is desired and then switched quickly to neon for slow and precise milling or xenon for fast milling. In preferred embodiments, switching from one ion species to another is performed without changing the gas source. In the prior art, changing the gas source, for example, involves interrupting sample processing, removing the gas source, emptying the gas that was previously being used, applying the new desired gas source, and inserting the source with the new gas into the apparatus. The replacement of the gas source is time-consuming, labor intensive, and can result in undesirable effects on the sample due to prolonged processing times.

Embodiments of the present invention can be used with high brightness electron sources, such as a field emission source, a Schottky source, Carbon Nano Tubes, or Nano Aperture Ion Sources. Embodiments of the present invention can also be readily implemented in gas sources such as the ion source described in U.S. Pat. No. 7,772,564, which has a gas leaked into a chamber and then is electron impact ionized by a focused electron beam. In certain embodiments, the present invention provides a gas chamber with multiple channels, each channel capable of having different gases and each channel containing an aperture for passing the electron beam. The gas species can be selected by focusing the electron beam into the desired channel, which then provides a focused ion beam for sample processing. In certain embodiments, Applicants have discovered that the ion species in the focused ion beam can be switched as fast as the time it takes for the electron beam to be deflected from one gas chamber aperture to another, which is preferably less than one second, more preferably less than 0.1 seconds, and most preferably less than 0.05 seconds.

Figure 1:
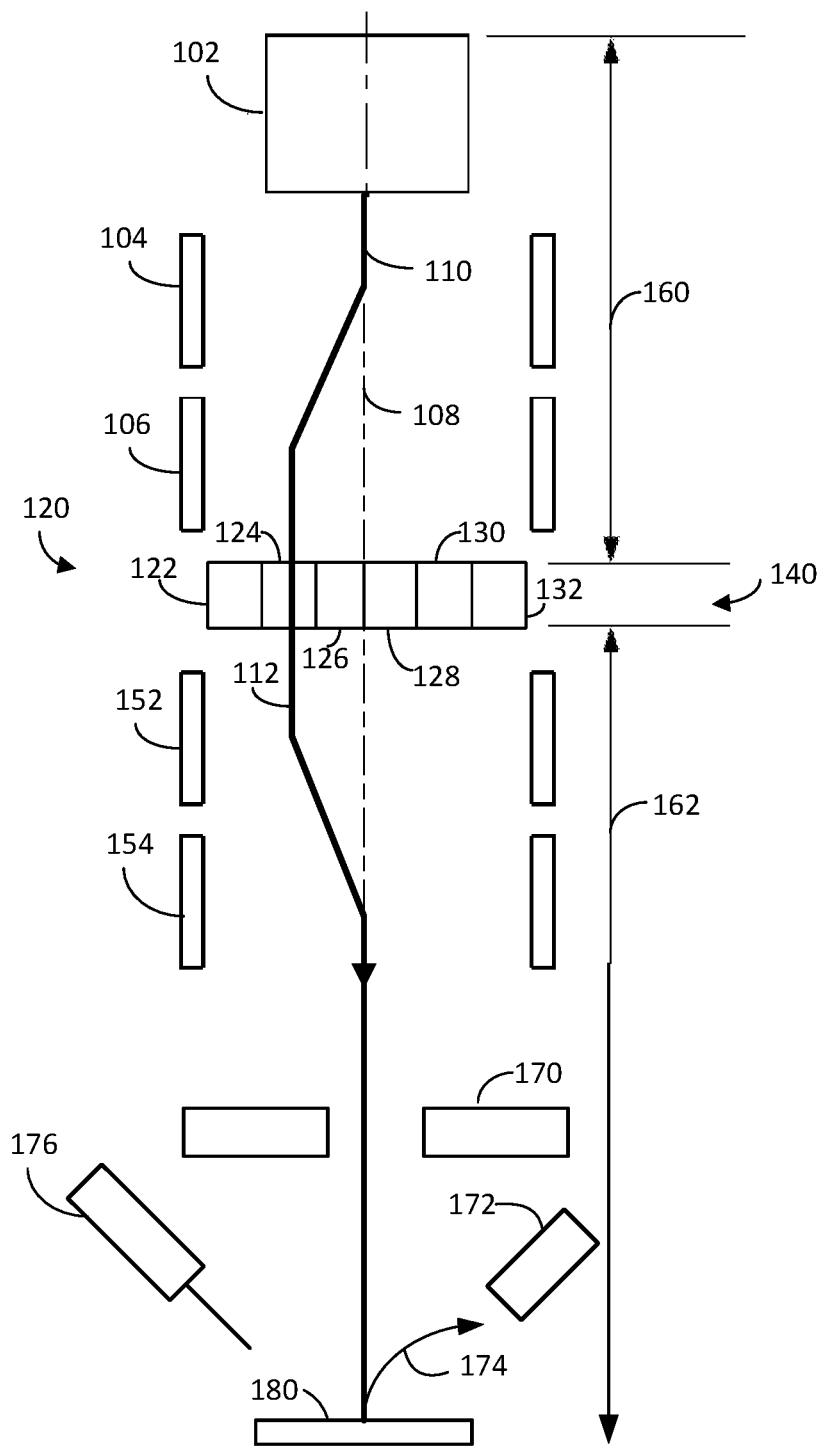
FIG. 1 shows a gas chamber with an electron source according to an embodiment of the present invention.

FIG. 1 shows a gas chamber with an electron source according to an embodiment of the present invention. Electron source 102 provides electrons 110 along an optical axis 108. The electron source 102 is typically a Schottky source, but other electron sources are also possible, including, but not limited to, thermionic, $LaB_6$, or cold field emission sources. The electrons are deflected by deflectors 104 and 106 with an electron optics region 160 to align the electron beam into a gas chamber 120. Deflectors 104 and 106 are illustrated in a double deflection configuration, but a single deflector may also be used in certain embodiments of the invention. The electron optics region 160 can also comprise other elements, for example focusing or condensing lenses to reduce the diameter of the electron beam to be smaller than the opening. Gas chamber 120 preferably comprises multiple channels 122, 124, 126, 128, 130 and 132, each channel preferably comprising a different gas. All natural occurring gases could be readily implemented within the channels. FIG. 1 illustrates the gas chamber comprising 6 channels, but skilled persons will readily appreciate that the number of channels could vary based on the application. For example, fewer channels can be used with simpler applications, but more channels could be used for more complicated processing applications that require many ion species for milling, imaging, and/or deposition. The number of gas species provided could thus be very large, only limited by the range of the deflectors 104 and 106. The deflection can be changed rapidly to direct the electron beam to different channels to switch between multiple ion species for processing a sample. Each of the gas channels typically has dimensions of about 100 nm-500 nm with gas pressures inside typically in the range of an atmosphere.

Figure 2:
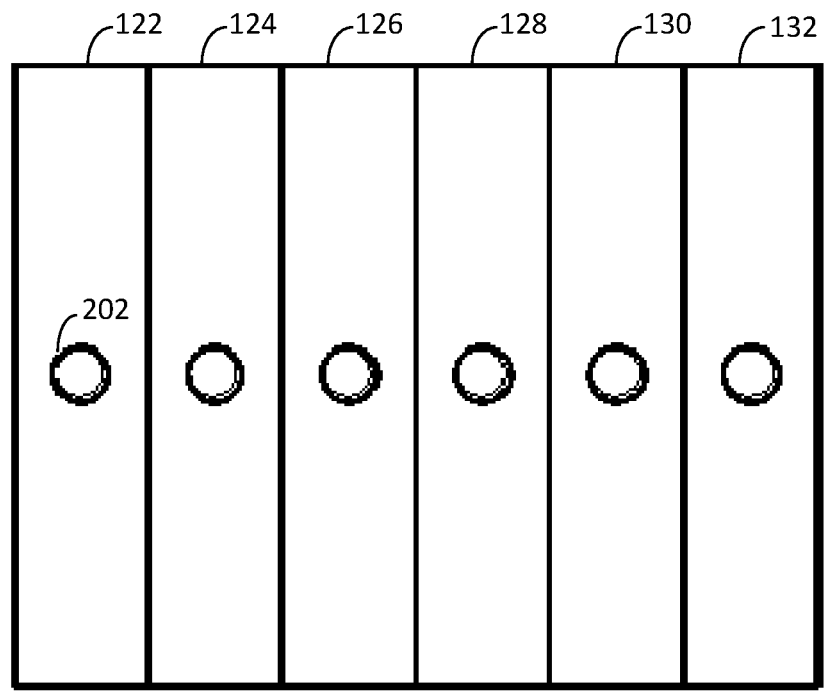
FIG. 2 shows a top view of the gas chamber of the embodiment shown in FIG. 1.

FIG. 2 shows a top view of the embodiment shown in FIG. 1. Each of the channels contains an entrance aperture 202 for passing the electron beam. The channels also preferably contain an exit aperture for extracting the ion beam. The exit aperture is typically directly below the entrance aperture 202.

Figure 3:
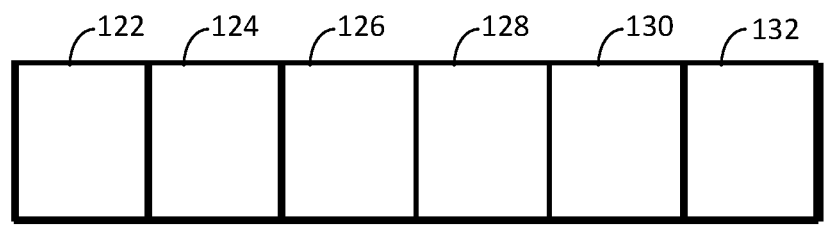
FIG. 3 shows a side view of the gas chamber of the embodiment shown in FIG. 1.
Figure 4:
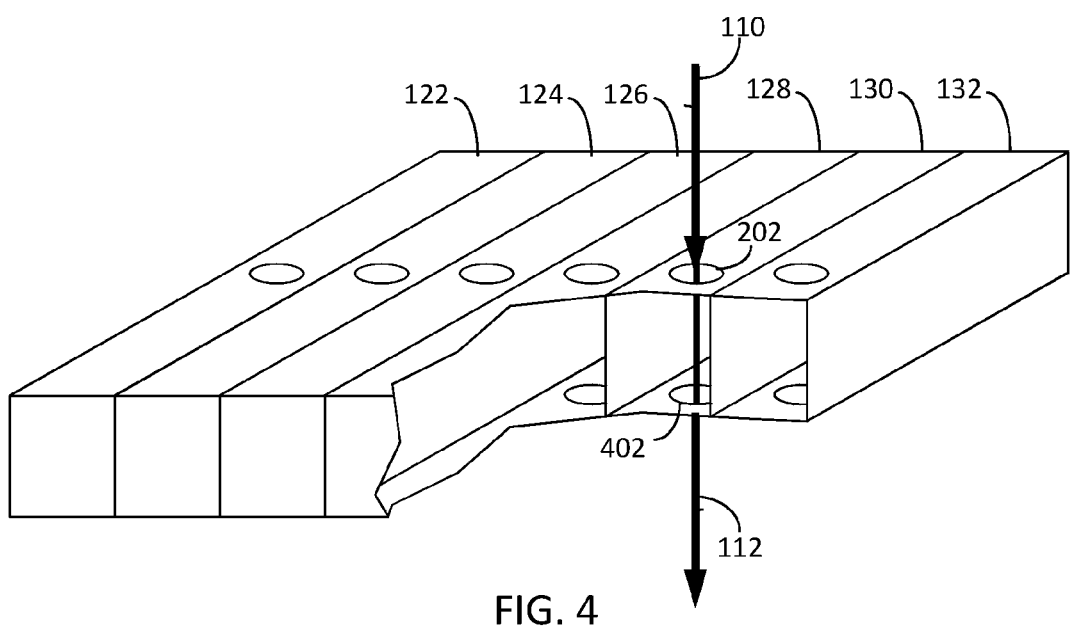
FIG. 4 shows an isometric view of the embodiment shown in FIG. 1 with a cutaway showing the arrangement of entrance and exit holes for the multiple gas channels.

FIG. 3 shows a side view of the embodiment shown in FIG. 1. FIG. 4 shows an isometric view of the embodiment shown in FIG. 1 with a cutaway showing the arrangement of entrance and exit holes for the multiple gas channels. Electron beam 110 has been deflected to enter gas channel 130 through entrance aperture 202, causing ion beam 112 to exit from exit aperture 402.

Figure 15:
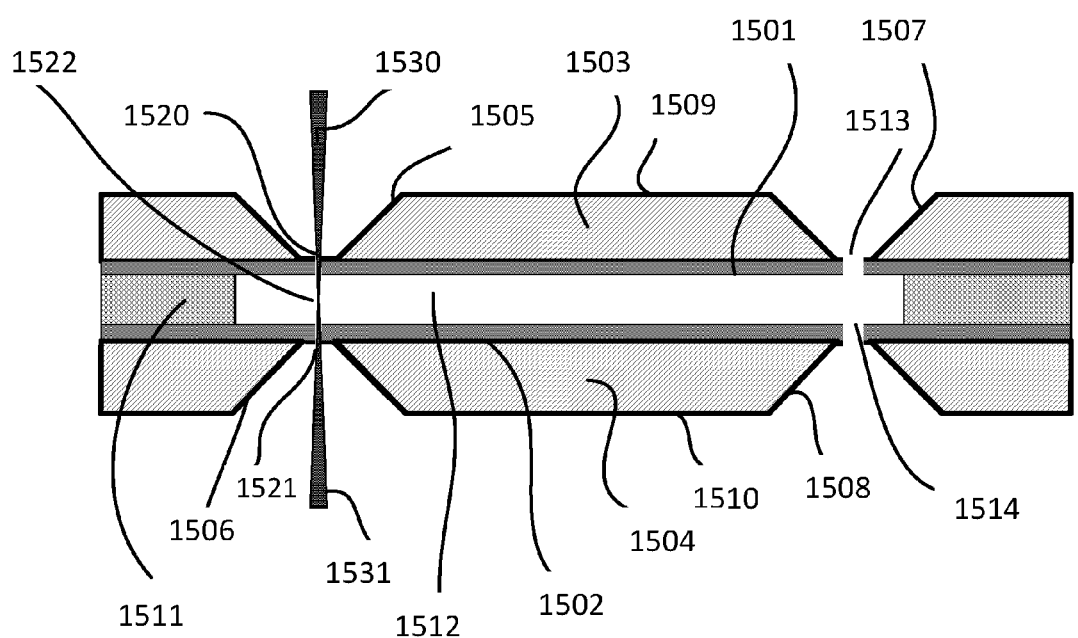
FIG. 15 schematically shows a MEMS structure for use in a gas channel according to an embodiment of the invention, whereby the electrons are focused on the ionization volume.

FIG. 15 schematically shows a MEMS structure for use in a gas channel according to an embodiment of the invention, whereby the electrons are focused on the ionization volume. Applicants note that FIG. 15 depicts only one gas channel which would be replicated for each of the multiple gas channels in certain embodiments of the invention.

Two conductive foils 1501, 1502 are attached to each other and separated from each other by a photoresist layer

1511 with a thickness of e.g. 1 μm. The photoresist layer does not fill the complete space between the two foils, but a cavity 1512 is left open. The foils 1501, 1502 are each formed on semiconductor dies cut from a semiconductor wafer, such as $Si_3N_4$ dies 1503, 1504. The material of the foils can be a metal, e.g. Mo. The dies give support to the foil and also enable production of the foil. In the dies recesses 1505, 1506, 1507 and 1508 are formed in a lithographic process. Also a conductive layer 1509, 1510 of e.g. Mo is formed on the $Si_3N_4$ dies. In the foils two sets of diaphragms are formed, the entrance diaphragm 1520 through which a focused electron beam 1530 enters the cavity 1512, an exit diaphragm 1521 through which ions can emerge from the cavity 1512, and apertures 1513 and 1514 through which gas is admitted to the cavity with a gas pressure of e.g. 0.2 bar. The entrance diaphragm and the exit diaphragm both have a small size of e.g. 100 nm, while the apertures through which the gas is admitted may have a larger size, of e.g. 1 μm. Applicants note that the terms "diaphragm" and "aperture" are interchangeable in the context of this invention.

The focused electron beam 1530 is produced by a high brightness electron source, such as a field emitter, a Schottky emitter or a CNT electron emitter, known per se. The produced electrons are accelerated and focused on the entrance diaphragm of the MEMS structure with focusing electron optics as known to the skilled artisan in the field of electron optics. Between the entrance diaphragm 1520 and the exit diaphragm 1521 concurrently a high gas pressure and a high electron density occur, thus forming an ionization volume 1522. A small voltage applied between the two foils 1501, 1502 of e.g. 1 V accelerate the ions formed in the direction of foil 1502, where they can leave the cavity 1512 through the exit diaphragm 1521, to be accelerated further towards particle-optical elements for the manipulation of the ions, known per se. The beam 1531 leaving the cavity 1512 through the exit aperture 1521 consists of both ions and electrons, but as the ions are accelerated towards the particle-optical elements for the manipulation of ions, the electrons are decelerated until they lose their forward momentum and are e.g. reflected back to conductive layer 1510.

As the entrance diaphragm and the exit diaphragm have a small size of e.g. 50 nm, the gas pressure outside the cavity 1512 as a function of the distance from the foils 1501, 1502 will drop very rapidly. Also, the amount of gas flowing from the cavity 1512 into the volumes outside the dies is very small, so that even when using pumping means with limited capacity, the ionization volume is limited to the region between the foils, as only between the foils the required high gas pressure exists. This also implies that no, or only negligible, charge exchange between gas molecules and ions occurs in the volume where beam 1531 enters. Such charge exchange is unwanted as this would lead to an energy broadening of the formed ion beam. Also, the gas pressure at the side where the electron source resides can easily be pumped to a vacuum pressure where these sources can work.

To admit gas to the apertures 1513 and 1514 the $Si_3N_4$ dies 1503, 1504 are e.g. attached between a holder connected to a gas supply, e.g. by clamping and/or using glue. In this way a bridge between the microscopic cavity and the macroscopic world where the gas resides can be formed. It is remarked that the $Si_3N_4$ dies need not have only two apertures to admit gas.

As will be obvious to the skilled artisan a ring of apertures can be formed around the position where the entrance or exit diaphragm is formed. Also, the apertures need not be round, but can have any shape. It is also possible to have apertures in one die (die 1503 or die 1504) only.

It is remarked that the use of wafers and photolithographic processes performed on them are known to be used in the manufacturing of miniature particle-optical structures, such as lenses and deflectors. Although not shown, such structures are envisaged to be incorporated in an ion source according to the invention.

Figure 16:
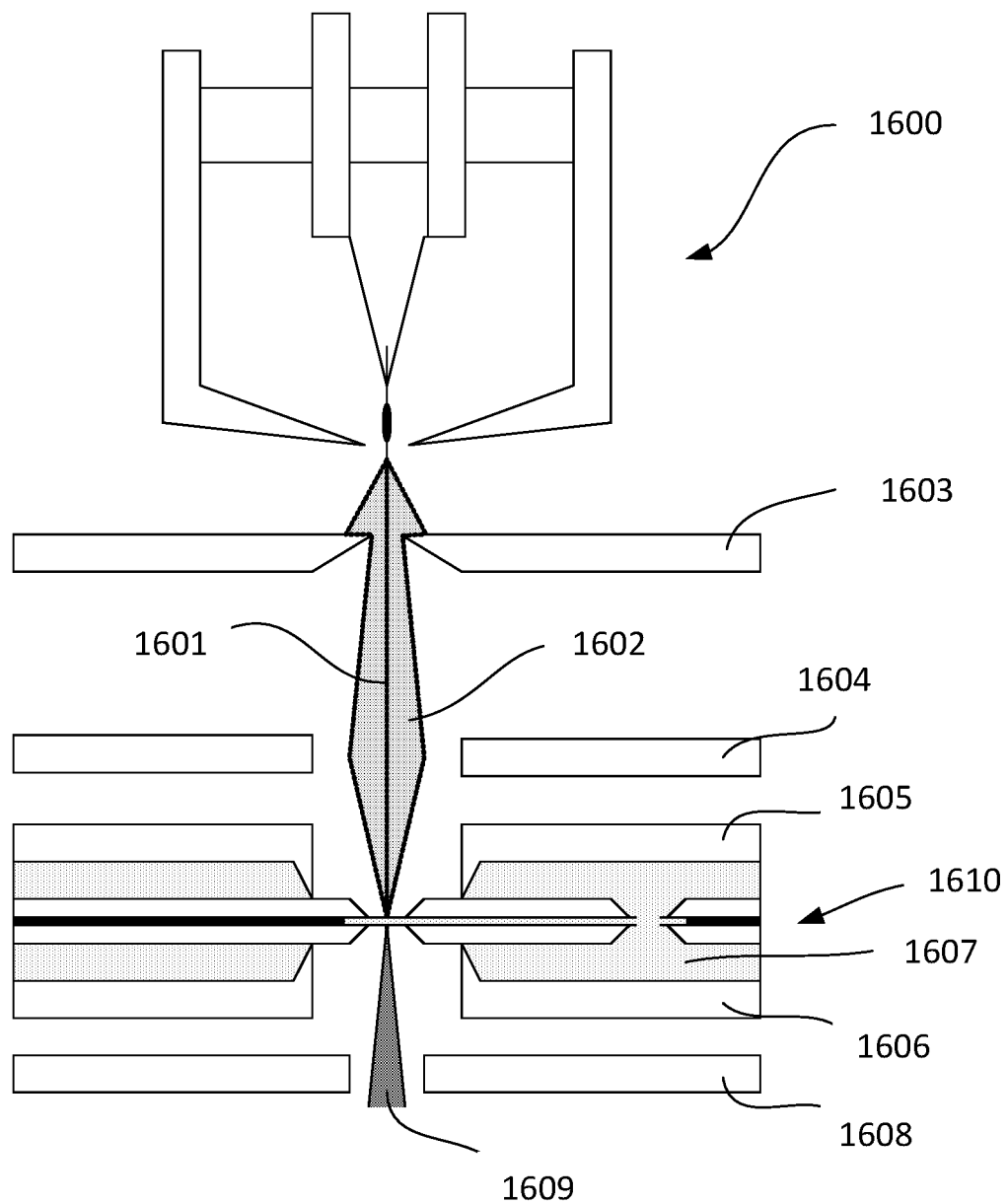
FIG. 16 is a schematic depiction of an ion source according to the invention employing the MEMS structure as depicted in FIG. 15.

FIG. 16 is a schematic depiction of an ion source according to the invention employing the MEMS structure as depicted in FIG. 15. FIG. 16 depicts a Schottky emitter 1600 as can be readily obtained from e.g. FEI Company, emitting a beam of electrons 1602 along an optical axis 1601. The electrons are extracted from the Schottky emitter by an electric field caused by a voltage difference between the tip of the emitter 1600 and the extractor electrode 1603. Preferably, the extractor electrode provides a voltage difference of between 50 and 300 V. Seen from the electron source the extractor 1603 is followed by a combined lens/deflector made by a segmented plate electrode 1604, where a voltage difference between the segments causes a deflector action and a voltage difference of the combined segments with respect to the extractor electrode 1603 and electrode 1605 causes a lens action. It is remarked that this segmented electrode 1604 can also be used as a stigmator.

Electrode 1605 is also connected to the side of the MEMS structure 1610 (the MEMS structure depicted in FIG. 3) where the electrons enter said MEMS structure. The other side of the MEMS structure is connected to electrode 1606. A voltage of e.g. 1 V between electrodes 1605 and 1606, and thus between the two foils of the MEMS structure, causes the electric field over the ionization volume. The connection of electrodes 1605 and 1606 form a vacuum seal with the MEMS structure 1610, and gas 1607 is entered via these electrodes to the cavity in the MEMS structure. As is known to the skilled artisan, the desired high electron current density at the ionization volume is typically achieved at an electron energy between approximately 50 and 1000 eV. The ionization efficiency of electron-ion collisions is typically maximized between 50 and 300 eV. Thus, electrons preferably have energy between 50 eV and 1000 eV, and more preferably between 50 and 300 eV at the ionization volume. Electrode 1608 extracts the ions formed in the MEMS structure 1610, resulting in a beam of ions 1609 emanating from the MEMS structure. The extraction field extracts the ions formed as a result of ionization out of the ionization volume in a direction opposite to the direction of the electron source. In certain embodiments of the present invention, the extraction field causes a voltage difference across the ionization volume of preferably less than 10V, even more preferably less than 5V, and most preferably less than 1V. Ions extracted out of the ionization volume can be subsequently further accelerated using particle-optical elements known per se.

Electrons will be directed, depending on the deflection by deflectors 104 and 106, toward one of the apertures of one of the multiple channels. In FIG. 1, electron beam 110 is aligned to pass through an aperture in channel 124, but the deflection can be modified such that the beam can pass through any of the multiple channels 122, 124, 126, 128, 130 or 132. In certain embodiments, the deflection can be changed in preferably less than 0.1 seconds to provide an ion beam of a different species. Within the channels, electrons collide with gas atoms in a gas ionization volume 140 to produce ions which are extracted from the channels through an exit aperture to form an ion beam 112. Electrons can be accelerated to the preferred energy levels by an acceleration field. In certain embodiments, a voltage source provides a voltage of preferably between 50 to 300 Volts so that electrons at the entrance aperture of the gas channels have an energy of 50 to 300 eV. Applicants note that FIG. 1 does not show detailed schematics of the multiple channels, but experts will readily realize that in certain embodiments, each of the multiple channels may include the components seen in FIG. 15 and FIG. 16, for example an extractor electrodes, apertures for gas admission into the ionization volume, and conductive foils. Further, in certain embodiments, electrodes are placed above each of the multiple channels to cause deflector and/or lens action as seen in FIG. 16.

Deflectors 152 and 154 deflect the ion beam 112 in an ion optics region 162 emerging from one of the multiple channels so that it is once again aligned with the desired axis 108. Even though double deflectors 152 and 154 are depicted, a single deflector may also be used to ensure the ion beam is aligned with the optical axis.

In certain embodiments, ion optics region 162 may also contain focusing elements such as objective lens 170 or additional apertures for focusing the ion beam toward a sample 180 for processing. Preferably, ion optics region 162 and electron optics region 160 are maintained in a vacuum. Ion optics region 162 may also include a secondary particle detector 172, such as an Everhart Thornley detector for detecting secondary electrons or ions 174, and a gas injection system 176 for injecting a precursor gas for bean induced deposition or etching. Suitable voltages are applied to the system components to provide sufficient energy to the electron beam to ionize gas ions in the channels and to extract the ions from the channels and accelerate them toward the sample.

Applicants have discovered a way to rapidly change ion species during high brightness applications with a gas source. In order to switch between different ion species, the properties of deflectors 104 and 106 are changed so that the electron beam 110 is directed toward a different channel of gas chamber 120. Altering the path of deflection can include, for example, changing the voltage applied to the deflector. Deflectors 152 and 154 are consequently also modified when the ion species is changed so that the ion beam is properly aligned with the desired axis 108 after passing through the selected gas channel.

Prior art electron sources often make use of deflectors above the single gas chamber to align the electron beam with the gas chamber, for example, when electrons are applied in a direction perpendicular to the field extracting ions from the ionization volume. However, Applicants have discovered that by incorporating a second set of deflectors 152 and 154 below the gas chamber, multiple gas channels as taught by the present invention can be used while maintaining the desired optical axis of the beam after the ionization region.

In certain embodiments of the invention, electrons from electron source 102 can be provided using "sideways injections" in a direction perpendicular to the axis of ion beam 112. Deflectors 104 and 106 then deflect the electron beam and direct the beam toward one of the multiple gas channels to provide ions of a desired species. The deflectors 152 and 154 then align the ion beam with the proper desired axis for processing a sample. Applicants have discovered that the alignment deflectors 152 and 154 are not necessary in certain embodiments where the gas chamber exit apertures are arranged such that they are all sufficiently close the ion optical axis 108. In some embodiments, this occurs when the furthest aperture is less than 5 μm from the optical axis.

In certain embodiments, one of the multiple channels can be left without a gas. By leaving one of the channels void of a gas, the electron beam is maintained and does not produce an ion beam when passing through the channel without a gas, and the electron beam can be directed at the sample for sample processing (including imaging). Further, a user can switch between different ion species and an electron beam.

Figure 5:
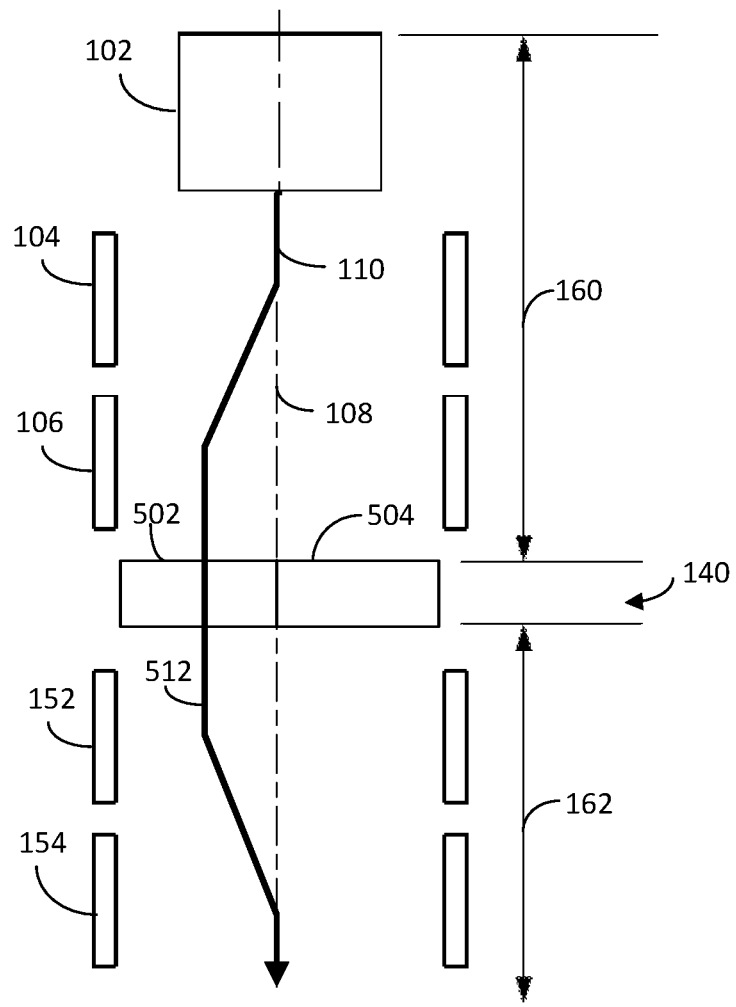
FIG. 5 shows a side view of a gas chamber of a nano aperture ion source according to another embodiment of the invention.

FIG. 5 shows a side view of a gas chamber of a nano aperture ion source according to another embodiment of the invention. In this embodiment, four gas channels 502, 504, 506, and 508 are arranged in a 2×2 pattern which enables the exit holes of each channel to be located nearer the optical axis and thus to reduce the required electron and ion beam deflections. Only gas channels 502 and 504 are visible from the view provided in FIG. 5. Each of the four gas channels can contain gases of any type of gas, such as noble gases, air, oxygen, nitrogen, or multi-atomic gases for various processes on a sample. Applicants have discovered that decreased deflections help reduce optical aberrations in the electron and ion beams and also reduce the required beam deflection voltages. In this embodiment, electron beam 110 has been deflected to enter gas channel 502, resulting in the generation of ion beam 512 with ions pertaining to the gas within chamber 502. The lower deflectors 152 and 154 place ion beam 512 onto the optical axis and parallel to the optical axis.

Figure 6:
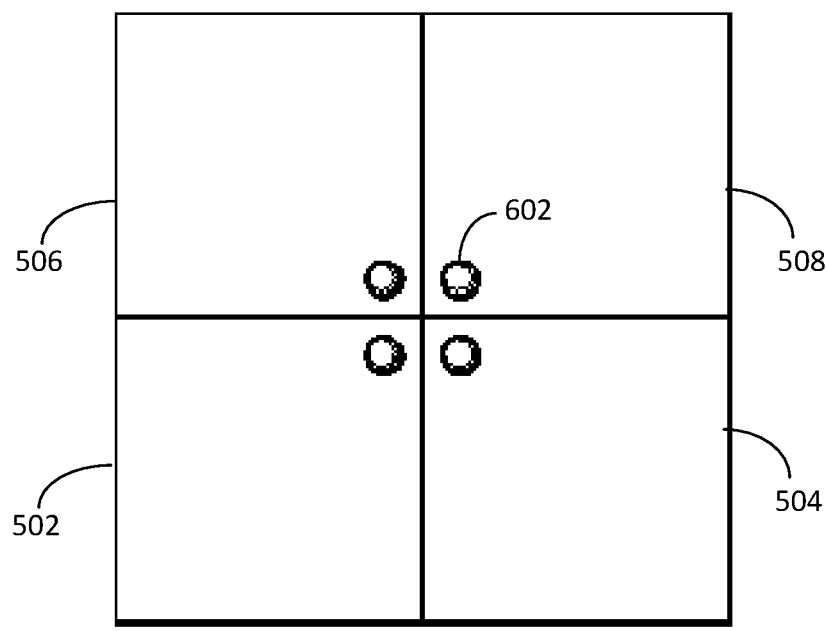
FIG. 6 is a top view of the embodiment shown in FIG. 5.
Figure 7:
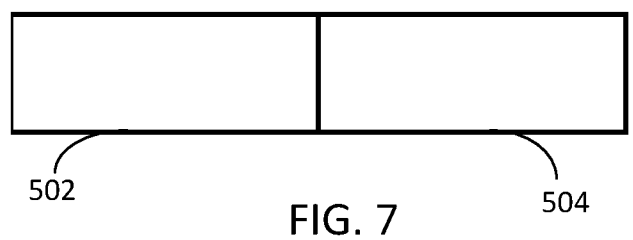
FIG. 7 shows a side view of the embodiment shown in FIG. 5.
Figure 8:
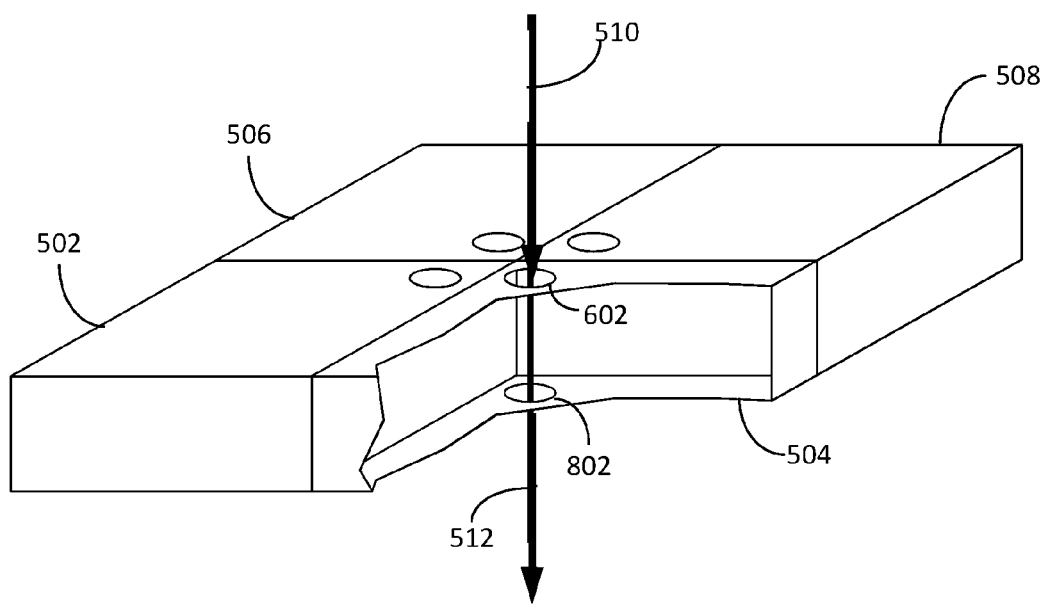
FIG. 8 shows an isometric view illustrating the embodiment shown in FIG. 5 with a cutaway showing the arrangement of entrance and exit holes.

FIGS. 6-8 show additional views of the embodiment shown in FIG. 5. FIG. 6 is a top view illustrating the 2×2 array of the four gas channels 502, 504, 506, and 508 of the embodiment shown in FIG. 5. Each gas channel has an entrance hole or aperture 602. An exit aperture is preferably located directly beneath entrance aperture 602. FIG. 7 shows a side view of the embodiment shown in FIG. 5.

FIG. 8 shows an isometric view illustrating the embodiment shown in FIG. 5 with a cutaway showing the arrangement of entrance and exit holes. In this illustration, electron beam 510 is directed toward channel 504 and enters the channel 504 through entrance aperture 602, causing ion beam 512 with an ion species from the gas provided in channel 504 to emerge from exit aperture 802. Exit aperture 802 is preferably located near the optical axis to reduce the required electron and ion beam deflections.

Figure 9:
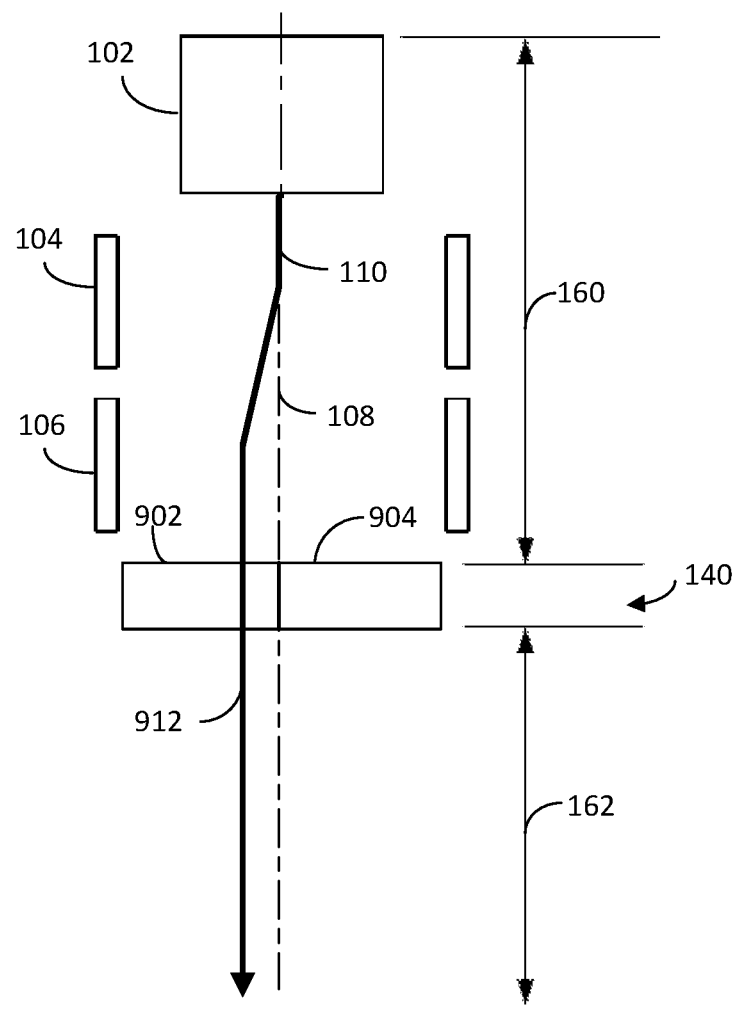
FIG. 9 shows a side view of another embodiment of the present invention in which the entrance aperture and exit apertures are close enough to the optical axis that lower deflectors below the chambers are not necessary.

FIG. 9 shows a side view of another embodiment of the present invention in which the entrance aperture and exit apertures are close enough to the optical axis that lower deflectors below the chambers are not necessary. Four gas channels 902, 904, 906, and 908 are arranged in a 2 by 2 array such as the array illustrated in FIG. 8. Only two channels 902 and 904 are visible in the view provided. Upper deflectors 102 and 104 steer the electron beam 110 toward chamber 902. In certain embodiments, only one deflector is sufficient to direct the beam toward one of the multiple chambers. Ionized gas beam 912 pertaining to the gas species in chamber 902 emerges from the exit aperture of channel 902. If the electron beam entrance aperture and the ion beam exit hole are near enough to the optical axis, lower deflectors are not necessary. Applicants have discovered that typically, lower deflectors are not necessary when exit holes are less than 5 um away from the optical axis 108. Decreased electron beam deflection may reduce optical aberrations in the electron beams and will also reduce the required electron beam deflection voltages. Since conventional mechanical alignments typically have the same size range of 5 um, the ion beam emerging from the exit aperture in this embodiment may be considered aligned even without the use of deflectors below the chambers. The deflection path can be controlled by a controller to direct the electron beam toward one of the multiple chambers.

Figure 10A:
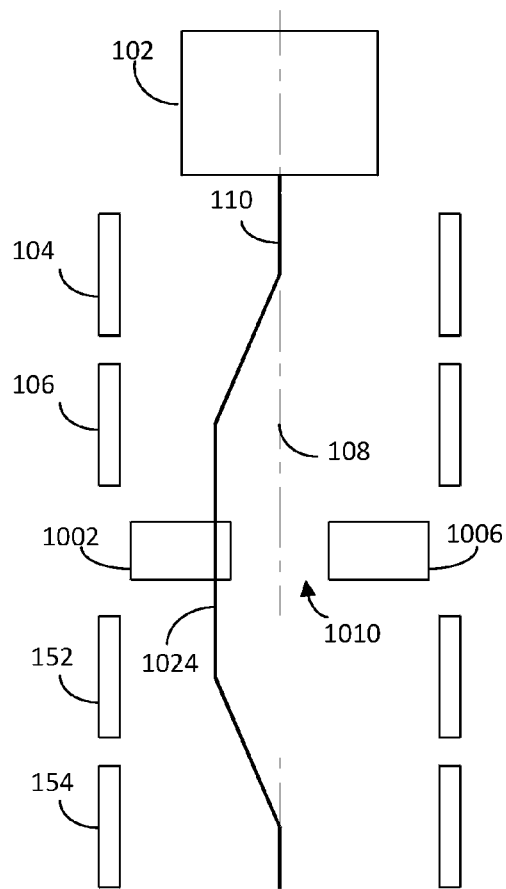
FIGS. 10A and 10B show side views of another embodiment of an ion and electron source according to the present invention capable of operating in two different operating modes: ion generating mode and electron generating mode.
Figure 10B:
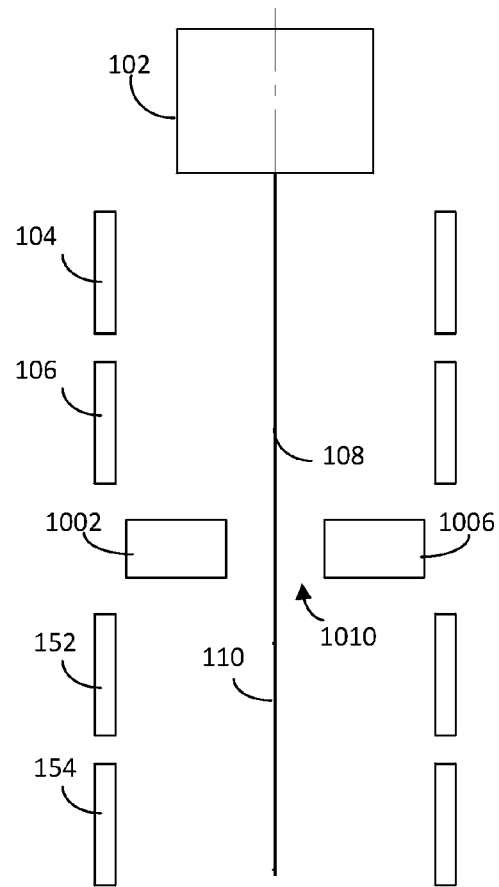
Figure 11:
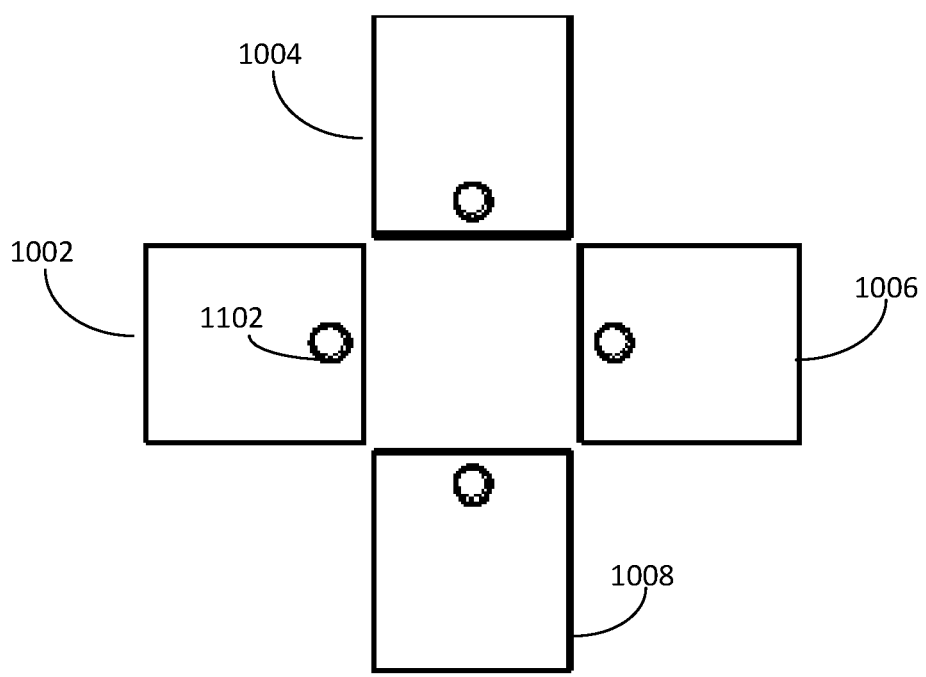
FIG. 11 shows a top view of the embodiment shown in FIGS. 10A and 10B
Figure 12:
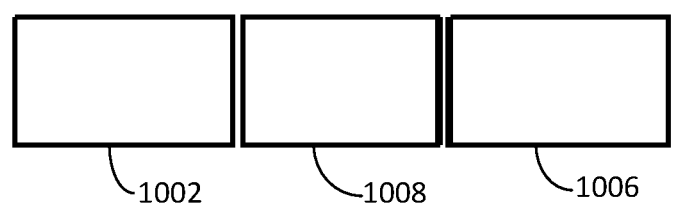
FIG. 12 shows a side view of the embodiment shown in FIGS. 10A and 10B.
Figure 13:
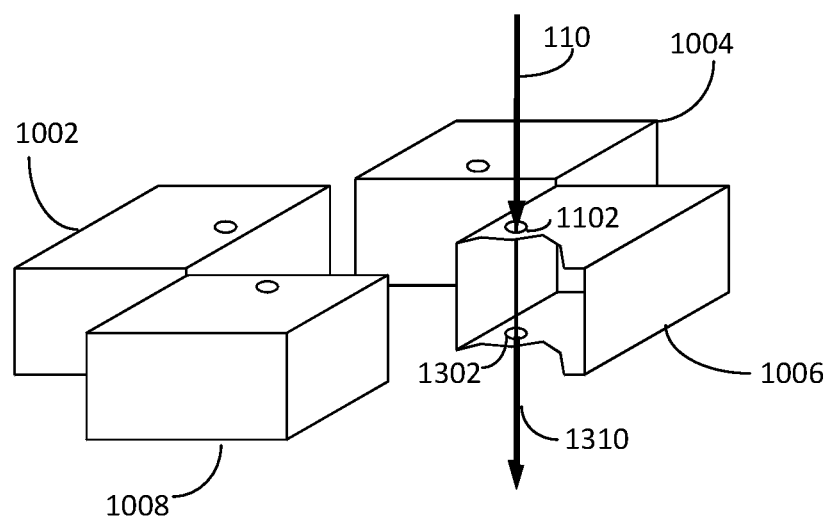
FIG. 13 shows a cutaway isometric view of the embodiment shown in FIGS. 10A and 10B.

FIGS. 10A and 10B show side views of another embodiment of an ion and electron source according to the present invention capable of operating in two different operating modes: ion generating mode and electron generating mode. FIGS. 11-13 show different views of the embodiment shown in FIGS. 10A and 10B. Four gas chambers 1002, 1004, 1006, and 1008 are arranged in a ring surrounding a central opening 1010. This arrangement allows the option of directing the electron beam 110 from the electron source to pass through the central opening 1010, thereby bypassing the gas chambers and then to be subsequently focused onto the sample, thereby enabling electron beam imaging and processing of a sample in addition to ion beam imaging and processing. Each gas chamber may contain any kind of gas. In FIG. 10A, the invention operates as an ion source. In FIG. 10A, the electron beam 110 is deflected into an entrance aperture of gas chamber 1002. The deflectors can deflect the beam into any one of the gas chambers 1002, 1004, 1006, and 1008 and the deflection path can be rapidly changed to select different species of ions by directing the beam toward different chambers with different gas species. Ion beam 1024 emerges from the exit aperture of the gas chamber 1002 and is deflected onto optical axis 108 by lower deflectors 152 and 154 and directed toward a sample for processing. In FIG. 10B, the invention operates as an electron source, as the electron beam 110 is not deflected into a gas chamber and passes through central opening 1010. The electron beam 110 bypasses the multiple gas chambers and is subsequently focused onto the sample. In certain embodiments, the electron beam remains on the optical axis after being produced from the electron source and does not need to be deflected.

The opening 1010 in the center of the array allows the electron beam to pass undisturbed. Experts will realize that in some processing and/or imaging applications, electrons are advantageous over ions due to their different properties. For example, electrons are advantageous for some subsurface imaging applications due to their smaller size. This embodiment thus allows switching between multiple ion species and further allows rapid switching from an ion beam to an electron beam and vice-versa for sample processing. The deflection path can be altered to direct the electron beam toward any one of the multiple chambers to produce ions of a certain species or toward the opening to remain an electron beam. Varying configurations and geometries of gas chambers can also be easily implemented in embodiments of the present invention. In certain embodiments, the deflection is not activated such that the electron beam passes through the central opening, and then the deflection is activated to deflect the beam toward one of the chambers to produce ions of a certain species.

FIG. 11 shows a top view of the embodiment shown in FIGS. 10A and 10B. FIG. 12 shows a side view of the embodiment shown in FIGS. 10A and 10B. The multiple chambers each have an entrance aperture 1102 and an exit aperture preferably directly underneath the entrance aperture for exiting the chamber. FIG. 13 shows a cutaway isometric view of the embodiment shown in FIGS. 10A and 10B illustrating the entrance aperture 1102 and the exit aperture 1302 in each of the multiple chambers. In FIG. 13, the electron beam 110 is directed toward chamber 1006 to select the ion species pertaining to the gas within chamber 1006 to produce an ion beam 1310. Although four chambers are illustrated, experts will realize that the number of chambers can be increased or decreased based on the needs of certain focused ion beam applications.

Other arrangements of the gas chambers, such as various two-dimensional arrays are also possible within the scope of the invention, for example 3 by 2, 4 by 2, or 5 by 2 arrays. Circular arrays of gas chambers are also within the scope of the invention with any number of chambers.

Figure 14:
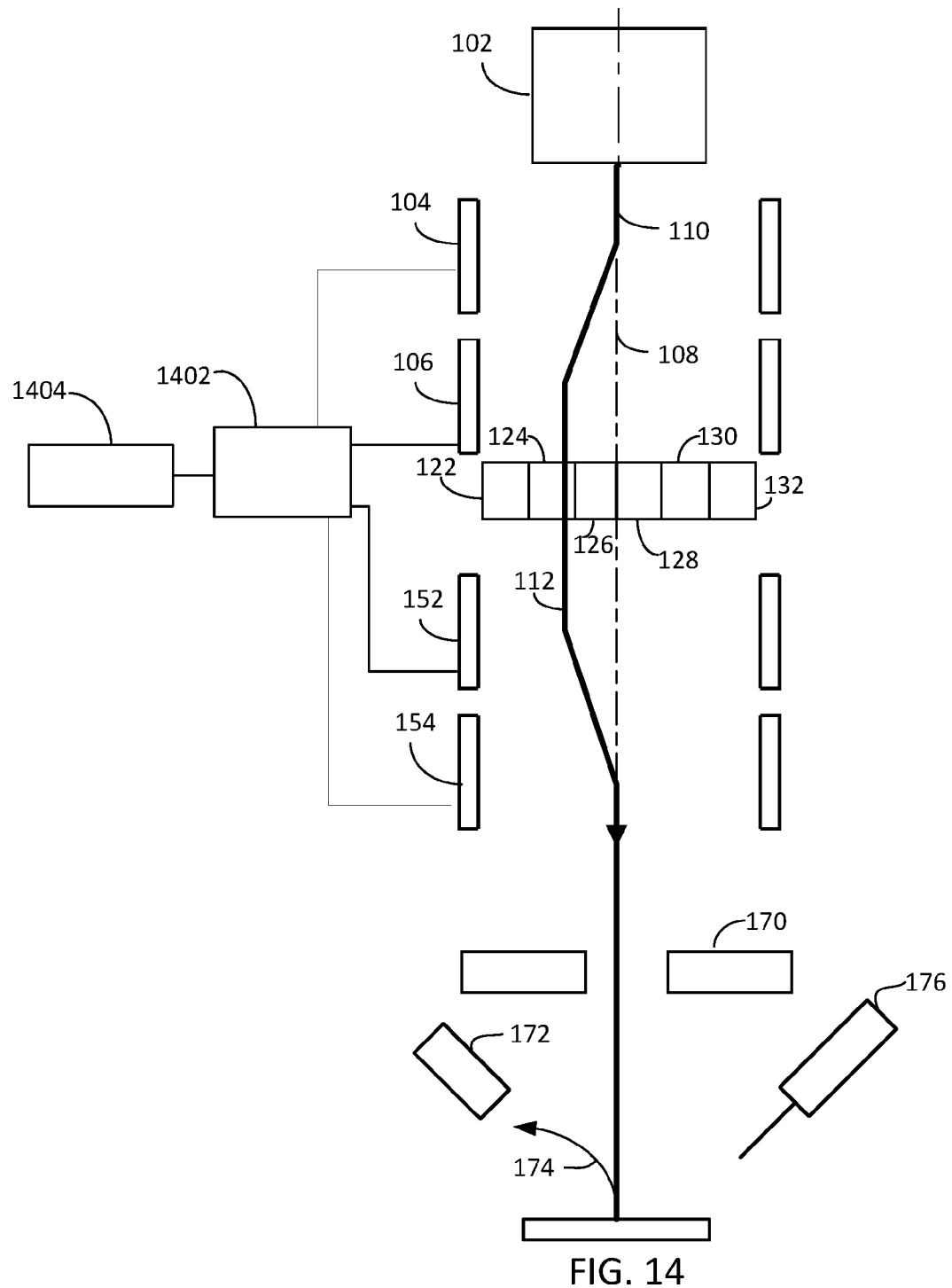
FIG. 14 shows an embodiment of the present invention in which deflectors are automated to automatically switch between different ion species.

FIG. 14 shows an embodiment of the present invention in which deflectors are automated to automatically switch between different ion species. Deflectors 104, 106, 152, and 154 are connected to a controller 1402, which controls the deflection path of the initial electron beam 110. During operation, a user can rapidly select the next ion species desired and the deflectors can be adjusted automatically to direct the electron beam to the channel containing the desired gas species. A user can also rapidly switch from an ion beam of a certain species to an electron beam in embodiments where one of the multiple chambers allows the electron beam to pass undisturbed. Applicants note that the term "connection" and "connected" as used in this application is not limited to a physical connection and can also include wireless communication as commonly known in the prior art. In one embodiment, controller 1402 is also connected to program memory 1404, which can store a set of instructions inputted from a user. A user can input a routine or a recipe that switches between different ion species in designated time intervals. The instructions preferably include processing parameters such as time of processing, beam dwell time, and/or instructions on the appropriate time to switch to a different species. The number of deflectors can also be changed to meet different application requirements. Further, a different number and arrangement of the gas channels can be used.

For purposes of this invention, the term "channel" is interchangeable with the term "chamber". The invention described above has broad applicability and can provide many benefits as described and shown in the examples above. The embodiments will vary greatly depending upon the specific application, and not every embodiment will provide all of the benefits and meet all of the objectives that are achievable by the invention. Even though much of the previous description is directed toward the use of FIB milling, the milling beam used to process the desired TEM samples could comprise, for example, an electron beam, a laser beam, or a focused or shaped ion beam, for example, from a liquid metal ion source or a plasma ion source, or any other charged particle beam. Further, although much of the previous description is directed at semiconductor wafers, the invention could be applied to any suitable substrate or surface. Materials and structures described in one embodiment or described as part of the prior art may be used in other embodiments. While the invention is described as suitable for providing a high brightness ion source, the invention is not limited to high brightness applications.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. The terms "including" and "comprising" are used in the claims below an open-ended fashion, and thus should be interpreted to mean "including, but not limited to . . . "

We claim as follows:

1. A charged particle beam system, comprising:
    an electron source for providing a beam of electrons along an optical axis within a vacuum chamber;
    multiple chambers, at least one of the multiple chambers having a gas inlet and adapted for containing gas to interact with the electrons to produce ions;
    a first deflector for selectively deflecting the electron beam into different ones of the multiple chambers or into a bypass area in which the electrons are passed through;
    one or more extractor electrodes for extracting ions from at least one of the multiple chambers; and
    a second deflector for aligning the extracted ions with the optical axis.

2. The charged particle beam system of claim 1 further comprising a focusing lens for focusing the extracted ions onto a work piece.

3. The charged particle beam system of claim 1 in which at least one of the multiple chambers includes an inlet for connecting to a gas source.

4. The charged particle beam system of claim 1 in which the first deflector includes two parts, a first part to deflect the electron beam away from the optical axis and a second part to deflect the electrons onto a second optical axis, parallel to the first optical axis and concentric with one of the multiple chambers.

5. The charged particle beam system of claim 1 in which the second deflector includes two parts, a first part to deflect the ion beam away from the second axis and a second part to deflect the ions onto the first optical axis.

6. The charged particle beam system of claim 1 further comprising a controller for controlling the alignment of the electrons from the first deflector and the alignment of the ions from the second deflector.

7. The charged particle beam system of claim 1 further comprising a program memory for inputting instructions for processing a sample, the instructions including switching from a first ion species to directing the electron beam at the sample during sample processing.

8. A method of providing multiple charged particle species for charged particle beam applications, comprising:
    generating a beam of electrons;
    passing the beam of electrons into a first chamber to interact with a gas in the chamber to produce charged particles of a first species;
    extracting the charged particles from the first chamber;
    directing the charged particles onto a work piece through a charged particle beam optical column; and
    passing the beam of electrons along a path not passing through the first chamber, to provide electrons through the charged particle beam optical column to the work piece.

9. The method of claim 8 in which extracting charged particles from the first chamber comprises extracting ions of a first species from the first chamber.

10. The method of claim 9 further comprising:
    passing the beam of electrons into a second chamber containing a gas to produce ions of a second species;
    extracting ions of the second species from the second chamber; and
    directing the ions of the second species onto the work piece, the method providing for switching between ions or electrons to be directed toward the work piece without opening the vacuum containing the work piece.

11. The method of claim 8 in which switching from passing the beam of electrons into a first chamber to passing the beam of electrons along a path not passing through the first chamber is performed in less than 0.1 seconds.

12. The method of claim 8 in which passing the electrons into a first chamber or passing the electrons along a path not passing through the first chamber includes deflecting the electrons from a first optical axis.

13. The method of claim 12 in which deflecting the electrons from a first optical axis includes deflecting the electrons onto a path parallel to the first optical axis.

14. The method of claim 12 further comprising deflecting the charged particles extracted from the first chamber or deflecting the electron beam back onto the first optical axis.

15. A charged particle beam system, comprising:
    an electron source operable to create an electron beam;
    a first chamber having a gas inlet and adapted for containing a gas to interact with the electrons of the electron beam to produce charged particles;
    an extractor operable to extract charged particles from the first chamber; and
    a charged particle optical column for directing a beam of charged particles toward a work piece;
    wherein the system is configured to selectively operate in either a first mode in which the electron beam passes into the first chamber and charged particles extracted from the first chamber are directed through the charged particle beam column toward the work piece, or in a second mode in which the electron beam passes through the charged particle optical column toward the work piece without passing through the first chamber.

16. The charged particle beam system of claim 15 further comprising a control device operable to selectively place the system in the first mode or in the second mode.

17. The charged particle beam system of claim 15 in which the extractor electrode is configured to extract ions from the first chamber.

18. The charged particle beam system of claim 15 further comprising a first deflector operable for deflecting the electron beam into the first chamber or for deflecting the electron beam to bypass the first chamber and a second deflector operable to align extracted charged particles or the beam of electrons with a focusing column.

19. The charged particle beam system of claim 15 further comprising one or more additional chambers adapted for containing a gas to interact with the electron beam to produce charged particles.

20. The charged particle beam system of claim 15 further comprising a second chamber that does not contain gas and in which the control device is programmed in the second mode to pass the electron beam through the second chamber that does not contain gas or outside of chambers containing gas.

* * * * *